United States Patent [19]

Reczek et al.

[11] Patent Number: 4,798,974
[45] Date of Patent: Jan. 17, 1989

[54] INTEGRATED CIRCUIT COMPRISING A LATCH-UP PROTECTION CIRCUIT IN COMPLEMENTARY MOS-CIRCUITRY TECHNOLOGY

[75] Inventors: Werner Reczek, Munich; Josef Winnerl, Landshut, both of Fed. Rep. of Germany

[73] Assignee: Siemens Aktiengesellschaft, Berlin and Munich, Fed. Rep. of Germany

[21] Appl. No.: 108,630

[22] Filed: Oct. 15, 1987

[30] Foreign Application Priority Data

Jan. 12, 1987 [DE] Fed. Rep. of Germany ....... 3700685

[51] Int. Cl.⁴ .................. H01L 27/10; W03L 1/00; H03K 3/354; H03K 3/013
[52] U.S. Cl. .................. 307/296 R; 307/296 A; 357/23.6; 357/42
[58] Field of Search .................. 307/296.2, 296.8, 304, 307/303, 296.5; 357/23.6, 24, 49, 41, 42

[56] References Cited

U.S. PATENT DOCUMENTS

| | | | |
|---|---|---|---|
| 4,591,738 | 5/1986 | Bialas et al. | 307/296.2 |
| 4,695,745 | 9/1987 | Mimoto et al. | 307/296.2 |
| 4,705,966 | 11/1987 | Van Zanten | 307/296.2 |
| 4,733,108 | 3/1988 | Truong | 307/296.2 |
| 4,736,121 | 4/1988 | Cini et al. | 307/296.2 |

OTHER PUBLICATIONS

Semiconductor Electronics Series 14, "Integrated MOS-Circuits", by H. Weib and K. Horninger, pp. 247–248.
Semiconductor Electronics Series 14, "Integrated MOS-Circuits", by H. Weib and K. Horninger, pp. 111–112.
D. Takacs et al, "Static and Transient Latch-Up Hardness in N-Well CMOS with On-Chip Substrate Bias Generator", IEDM 85, Technical Digest, pp. 504 to 508.

Primary Examiner—Stanley D. Miller
Assistant Examiner—David R. Bertelson
Attorney, Agent, or Firm—Hill, Van Santen, Steadman & Simpson

[57] ABSTRACT

An integrated circuit has a storage cell and complementary MOS-circuit technology. A substrate bias voltage generator connects a semiconductor substrate having a well region inserted therein to a substrate bias voltage. In order to avoid latch-up effects, an electronic protection circuit connects a current path, for charging a capacitor of the storage cell, only after a delay time $\Delta T$ following a switch-on of the integrated circuit.

15 Claims, 2 Drawing Sheets

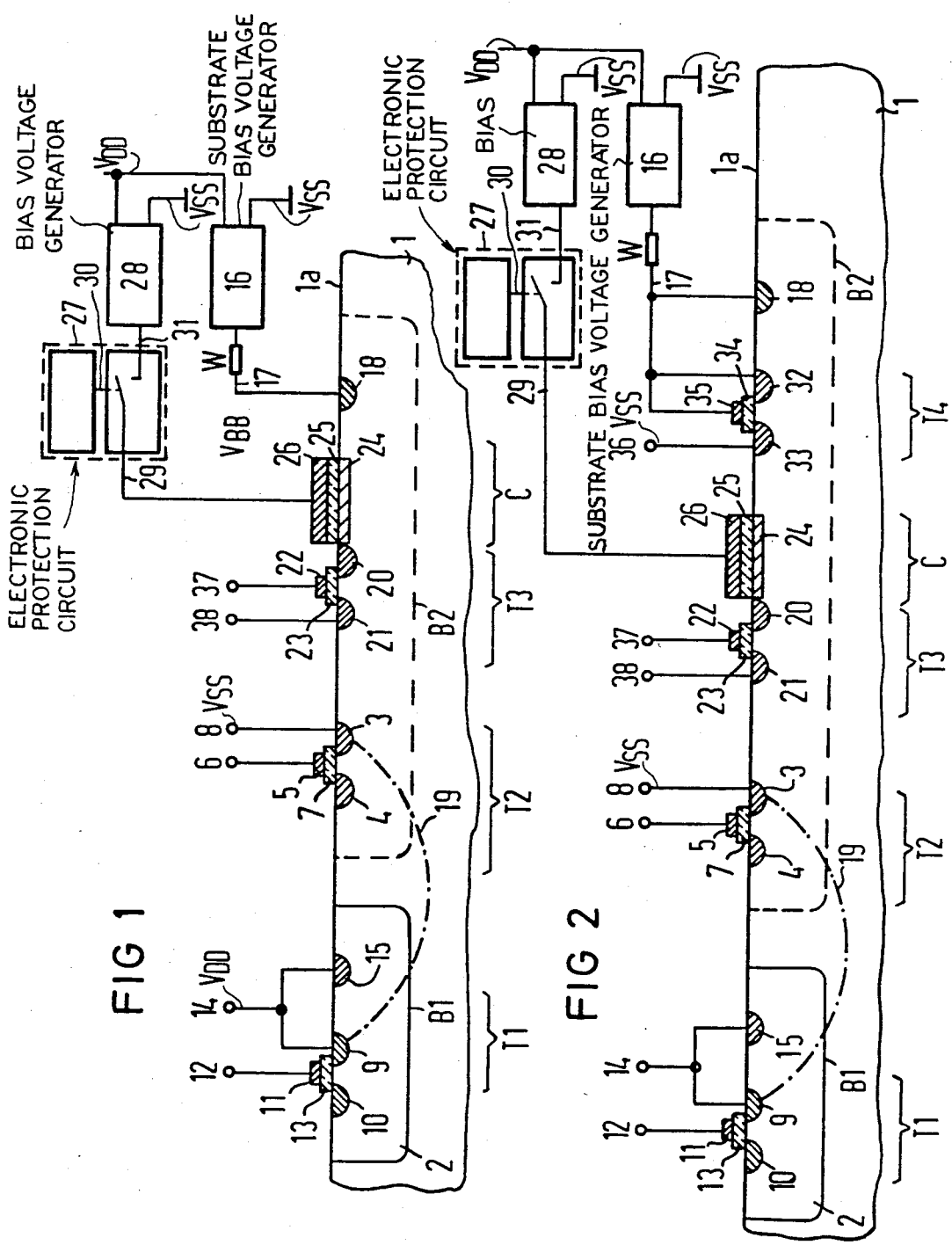

INTEGRATED CIRCUIT COMPRISING A LATCH-UP PROTECTION CIRCUIT IN COMPLEMENTARY MOS-CIRCUITRY TECHNOLOGY

BACKGROUND OF THE INVENTION

The invention relates to an integrated circuit comprising a latch-up protection circuit in complementary MOS-circuitry technology wherein a substrate is provided having a substrate bias voltage terminal thereon which is connected to an output of a substrate bias voltage generator.

In integrated circuits of this type designed in complementary MOS-technology, the semiconductor substrate is not connected to the ground potential of the integrated circuit but is negatively charged by a substrate bias voltage generator. The substrate bias voltage of the substrate bias voltage generator reduces the transistor and junction capacitances and improves the switching speed. In the case of a semiconductor substrate composed of p-conducting material, which is provided with an inserted, n-conducting, well-like semiconductor zone, this is a negative substrate bias voltage of approximately −2 to −3 volts. The source zones of field effect transistors arranged on the semiconductor substrate outside the well-like semiconductor zone are connected to ground potential.

At the moment at which the positive supply voltage is switched on, the p-conducting semiconductor substrate in question first assumes a floating state in which it is cleared of external potentials.

This state is brought to an end by the actuation of the substrate bias voltage generator. The interval of time between the switching on of the supply voltage and the actuation of the substrate bias voltage generator is fundamentally influenced by the clock frequency, prevailing coupling capacitances, and the prevailing capacitive load. During the floating time, via the junction capacitances which exist on the one hand between the well-like semiconductor zone and the substrate, and on the other hand between those source zones connected to ground potential and the substrate, the semiconductor substrate can be temporarily charged to a positive bias voltage which does not disappear unil the substrate bias voltage generator is actuated, and which is replaced by the negative substrate bias voltage which gradually builds up at the output of the generator. However, also during the operation of the integrated circuits, more powerful currents which are shunted from the semiconductor substrate via the substrate bias voltage generator to a terminal of the latter which carries ground potential, can lead to a positive bias voltage of the semiconductor substrate as a result of the voltage drop across the internal resistance of the substrate bias voltage generator. Positive bias voltages represent a high security risk for the integrated circuit, however, since a latch-up effect can be triggered which generally results in the break-down of the integrated circuit.

In explaining the latch-up effect, let it be assumed that in general four consecutive semiconductor layers of alternating conductivity types are arranged between one terminal of the field-effect transistor of the first channel type, located in the well-like semiconductor zone, and one terminal of a field effect transistor of the second channel type located on the semiconductor substrate outside of this zone. The first terminal zone of the first-mentioned transistor forms the first semiconductor layer, the well-like semiconductor zone forms the second semiconductor layer, the semiconductor substrate forms the third semiconductor layer, and the first terminal zone of the last transistor forms the fourth semiconductor layer. This construction serves to form a parasitic, bipolar pnp-transistor and npn-transistor. The collector of the pnp-transistor corresponds to the base of the npn-transistor, and the base of the pnp-transistor corresponds to the collector of the npn-transistor. This structure forms a pnpn four-layer diode as in the case of a thyristor. When the semiconductor substrate carries a positive bias voltage, the pn-junction between the third and fourth semiconductor layers can be biased in the conducting direction to such an extent that between the aforesaid transistor terminals a current path is formed which can be traced to a parasitic thyristor effect within this four-layer structure. The current path remains even after the reduction of the positive substrate bias voltage and can thermally overload the integrated circuit.

In order to reduce the transistor and junction capacitances, it is known to use a negative substrate bias voltage in NMOS-technology, which is generated via a so-called substrate bias voltage generator on the integrated circuit (see the Semiconductor Electronics Series 14, "Integrated MOS-circuits" by H. Weiss and K. Horninger, page 247–248). The latchup effect in the case of positive semiconductor substrate voltages is likewise described on pages 111–112 of this book. Modification of the technology (doping profiles) or design techniques (trough spacings) are proposed as possible remedies. Another proposal to suppress the latch-up effect is described in the publication by D. Takacs et al, "Static and Transient Latch-up Hardness in N-Well CMOS With On-Chip Substrate Bias Generator", IEDM 85, Technical Digest, pages 504 to 508. There it is proposed to provide a clamping circuit which prevents a latch-up effect by limiting the semiconductor substrate potential to a value which is insufficient to activate the parasitic bipolar transistors in the semiconductor substrate. For this purpose, the clamping circuit shunts the high capacitive charge currents to ground.

Fundamentally, the above-described clamping circuit does not rule out the possibility of positive charging on the semiconductor substrate but merely compensates the effects thereof, since if a positive charging of the semiconductor substrate has occurred, a low-ohmic ground connection dissipates positive charge.

SUMMARY OF THE INVENTION

An object of the present invention is to provide a circuit of the type referred to in the introduction in which the occurrence of latch-up effects is largely avoided. This is achieved in accordance with the invention wherein a capacitor is provided having first and second capacitor surfaces. The first capacitor surface is integrated in the doped semiconductor substrate. The second capacitor surface is connected via an electronic protection circuit to a capacitor bias voltage generator. When the integrated circuit is switched on, the electronic protection circuit interconnects the second capacitor surface and the bias voltage generator for the capacitor following a delay time $\Delta T$.

An advantage which can be obtained by means of the invention is that an undesirably high charging of the semiconductor substrate, which can trigger a latch-up effect, is limited by simple techniques to a value which eliminates this danger.

BRIEF DESCRIPTION OF THE DRAWINGS

FIG. 1 is a diagram of an integrated circuit comprising a latch-up protection circuit in CMOS-circuitry technology comprising a one-transistor storage cell;

FIG. 2 is a diagram of an integrated circuit comprising a latch-up protection circuit corresponding to FIG. 1, additionally equipped with a clamping circuit;

DESCRIPTION OF THE PREFERRED EMBODIMENTS

Figure 3:
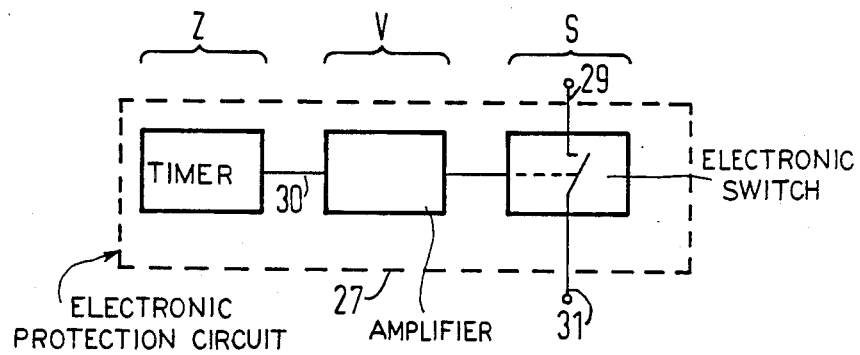
FIG. 3 is a fundamental circuit diagram of a latch-up protection circuit.

FIG. 1 is a diagram of an integrated circuit corresponding to the invention comprising a latch-up protection circuit constructed on a semiconductor substrate 1 formed of doped semiconductor material, for example p-conducting silicon. The semiconductor substrate 1 comprises an n-conducting, well like semiconductor zone 2 which extends to the boundary surface 1a of the semiconductor substrate 1. Outside of the semiconductor zone 2, n+-doped semiconductor zones 3, 4, 20 and 21, which form the source and drain zones of two n-channel field effect transistors T2 and T3, are inserted into the semiconductor substrate. The capacitor C, which can be of arbitrary design, in this case consists of a planar dielectric layer 25, a planar polysilicon layer 26, and an n-doped layer 24, and together with the n-channel field effect transistor T3 forms a one-transistor storage cell into which information can be input or from which information can be read. The channel zone located between 3 and 4 and between 20 and 21 is covered by a respective gate 5 and 22 which is provided with a respective terminal 6 and 37, and is separated from the boundary surface 1a by a respective thin, electrically-insulating layer 7 and 23 formed of, for example, $SiO_2$. The drain zone 21 is connected to a terminal 38, whereas the source zone 3 is connected to the terminal 8 which carries ground potential $V_{SS}$. p+-doped zones 9 and 10, which represent the source and drain zones of a p-channel field effect transistor T1, are also inserted into the semiconductor zone 2. The channel zone located betwen the zones 9 and 10 is covered by a gate 11 provided with a terminal 12 and separated from the boundary surface 1a by a thin, electrically-insulating layer 13, consisting, for example, of $SiO_2$. The source zone 9 of the field effect transistor T1 is connected to a terminal 14 which is connected to the supply potential $V_{DD}$. The semiconductor zone 2 is connected to the supply voltage $V_{DD}$ via an n+-doped contact zone 15 connected to the terminal 14.

A substrate bias voltage generator 16 is also provided, which generates a negative substrate bias voltage of, for example, −2 to −3 volts, and is itself connected to ground $V_{SS}$ and to the supply voltage $V_{DD}$. The output 17 of the substrate bias voltage generator is connected to a p+-doped substrate voltage terminal 18 inserted into the semiconductor substrate 1. Thus, the semiconductor substrate 1 carries the negative substrate bias voltage $V_{BB}$ generated by 16, whereas the source zones, for example 3 of the transistors such as T2 arranged in the semiconductor substrate 1, carry ground potential $V_{SS}$. One of the effects of this is that the junction capacitances of the drain and source zones of the transistors arranged in the semiconductor substrate 1 are reduced.

To avoid a latch-up effect which can occur between the terminals 8 and 14 along the four-layer structure 3, 1, 2 and 9 on the broken line 19, the capacitive charge currents of the capacitor C are interrupted by the electronic protection circuit 27 for a time interval $\Delta T$ following switch-on until the substrate is negatively charged, so that no latch-up effect is triggered. In the electronic protection circuit 27, when the integrated circuit has been switched on, the input 31 is electrically connected to the output 29, which is connected to a capacitor surface 26 of the capacitor C, only following a time delay $\Delta T$. The input 31 is connected to a bias voltage generator 28 for the capacitor, which is itself connected to ground $V_{SS}$ and to the supply voltage $V_{DD}$. The output voltage of the bias voltage generator can amount, for example, to half the supply voltage, and thus to $V_{DD}/2$. When the integrated circuit is switched on, the electronic protection circuit interrupts the connection between the input 31 and the output 29. This means that the capacitive charge currents from the bias voltage generator 28 to the capacitor C are suppressed for a time $\Delta T$ following the connection of $V_{DD}$. In normal operation and after the time $\Delta T$, the capacitor surface 26 is connected in low-ohmic fashion via the electronic protection circuit 27 to the bias voltage generator 28 for the capacitor.

FIG. 2 is a diagram of a second exemplary embodiment of the invention which differs from FIG. 1 in view of an additional clamping circuit. The output 17 of the substrate bias voltage generator 16 is for this purpose connected via an electronic switch—here a field effect transistor T4—to a circuit point which carries ground potential $V_{SS}$. In the illustrated exemplary embodiment, this circuit point is the terminal 36. Considered in detail, in the arrangement in FIG. 2, the output 17 is connected to an n+-doped semiconductor zone 32 which is inserted into the semiconductor substrate 1. A further n+-doped semiconductor zone 33, inserted into the semiconductor substrate 1, is connected to the circuit point which carries ground potential $V_{SS}$, i.e. to the terminal 36. That zone of the semiconductor substrate 1 which lies between the zones 32 and 33 is covered by a gate 35 which is separated from the boundary surface 1a by a thin, electrically-insulating layer 34, consisting for example of $SiO_2$. Together with the components 34 and 35, the zones 32 and 33 form an n-channel field effect switching transistor T4. T4 is driven via the node 17.

The switching transistor 32 to 35 in FIG. 2 is to have a low start voltage which is lower than the conducting voltage of the pn-junction between 1 and 3. This can be achieved in the conventional manner, for example in that other than the substrate doping, which amounts to for example $10^{15}$ cm$^{-3}$, the zone of the semiconductor substrate 1 located between the zones 32 and 33 has no additional doping, while the channel zones of the other field effect transistors, for example T2, are provided in the vicinity of the boundary surface 1a with an additional doping. This additional doping reinforces the substrate doping and is expediently introduced by implantation in a dose of approximately $10^{12}$ cm$^{-2}$. If two different insulating layer thicknesses are available in the production technology employed, then it is expedient to use the smaller layer thickness, which amounts, for example, to 15 nm, for 34, whereas a thickness of approximately 20 to 25 nm is selected for the layers 7 and 13. If the semiconductor substrate 1 is connected to a positive bias voltage, which occurs for example when the supply voltage $V_{DD}$ is connected and the substrate bias voltage generator 16 has not yet reached the full negative voltage as already explained with reference to FIG. 1, the gate 35 is likewise correspondingly positively biased. Thus, when the low start voltage is overshot, the switching transistor 32 to 35 becomes conductive. As a result, the voltage across the node 17 is limited to the value of the low start voltage.

Whereas the electronic protection circuit interrupts the capacitive charge current of the capacitor C for a time ΔT following switch-on in order to prevent positive charging by this charge current of the semiconductor substrate 1, the additional clamping circuit serves to counteract all other possibilities wherein the substrate may become positively charged. If during operation, for example, powerful currents occur which are discharged to ground $V_{SS}$ via the semiconductor substrate 1 and the components 18, 17, 16, a voltage drop can occur across the internal resistance W of 16 which causes the output 17 and thus the semiconductor substrate 1 to be connected at least temporarily to a positive bias voltage. In this case, these currents are discharged via the additional clamping circuit.

The substrate bias voltage generator 16, the electronic protection circuit 27, and the bias voltage generator 28 for the capacitor in FIGS. 1 and 2 are preferably co-integrated on the semiconductor substrate.

FIG. 3 is a fundamental diagram of the electronic protection circuit 27. This consists of three individual components, a timer Z, an amplifier V, and an electronic switch S having an input 31 and an output 29. When the integrated circuit is switched on, at the output 30 the timer Z emits a signal which causes the input 31 and the output 29 in the electronic switch S to be electrically isolated from one another. Following a time ΔT, the time switch emits a signal so that in the electronic switch S the input 31 and the output 29 are reconnected to one another. The amplifier V can be optionally included, depending upon the necessary adaptation of the output signal of the timer Z to the electronic switch S.

Figure 4:
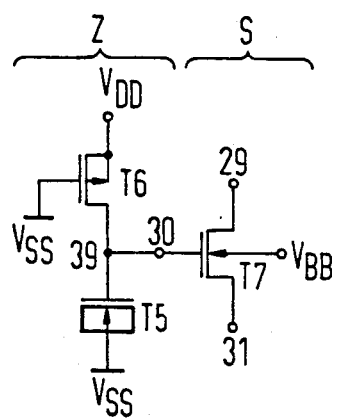
FIGS. 4 and 5 are diagrams of exemplary embodiments of a latch-up protection circuit with an ohmic load.
Figure 5:
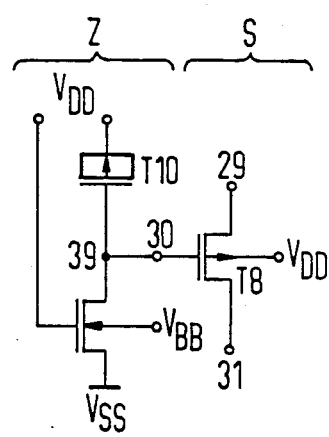

Two exemplary embodiments of an electronic protection circuit 27 with an ohmic load are represented in FIGS. 4 and 5. These consist only of two components, a timer Z and an electronic switch S.

In FIG. 4, the timer Z is provided with a series arrangement of an n-channel field effect transistor T5, which forms a capacitor, and an ohmic load element which is formed in particular by a p-channel field effect transistor T6, the substrate of which is connected to a source terminal. The gate of the field effect transistor T6 is connected to ground $V_{SS}$. The first terminal of the series arrangement is connected to the supply voltage $V_{DD}$ and to the source terminal of the field effect transistor T6, whereas the other terminal is connected to ground $V_{SS}$ and to the source, drain, and substrate terminal of the field effect transistor T5. The output 30 of the timer is formed by the gate terminal of the field effect transistor T5 and the drain terminal of the field effect transistor T6. The electronic switch S consists of an n-channel field effect transistor T7. The source terminal and drain terminal form the output 29 and the input 31 respectively of the electronic protection circuit 27. The connection point 39 is connected to the gate of the n-channel field effect transistor T7, whereas the substrate terminal of the field effect transistor T7 is connected to a negative voltage $V_{BB}$.

The connection point 39 in FIG. 4 is connected to ground $V_{SS}$ via the capacitor, which is empty on switch-on, so that the field effect transistor T7 blocks and the connection between the input 31 and the output 29 is interrupted. When the capacitor has charged after a time ΔT and a voltage at the connection point 39 is equal to or greater than the sum of the voltage at the input 31 of the field effect transistor T7 and the start voltage of the same field effect transistor, the n-channel field effect transistor becomes conductive and connects the input 31 to the output 29. In operation, the capacitor is charged and the electronic protection circuit in FIG. 4 is free of shunt currents.

FIG. 5 is a diagram of a circuit variation of FIG. 4, including a p-channel field effect transistor T8 as electronic switch S. The timer Z is again formed by a series arrangement formed of a p-channel field effect transistor T10 connected as a capacitor, and of an ohmic load element. The ohmic load element, in this case an n-channel field effect transistor T9, is connected by its gate terminal to a supply voltage $V_{DD}$ and by its substrate terminal to a negative voltage $V_{BB}$. The first terminal of the series arrangement is connected to ground $V_{SS}$, whereas the other terminal, which is formed by the substrate, source, and drain terminal of the field effect transistor T10, is connected to the supply voltage $V_{DD}$. The connection point 39 and the output 30 of the timer are connected to the gate of the p-channel field effect transistor T8, whereas the substrate terminal of the field effect transistor T8 is connected to a positive voltage $V_{DD}$. The source and drain terminals of the field effect transistor T8 form the input 31 and output 29 respectively of the electronic protection circuit.

The mode of functioning of the circuit in FIG. 5 is similar to that of the circuit in FIG. 4. For such time as the capacitor is uncharged, the field effect transistor T8 blocks. After a time ΔT, measured from the time of switch-on of he integrated circuit, the capacitor is charged and the voltage at the connection point 39 is equal to or smaller than the sum of voltage at the input 31 of the field effect transistor T8 and the start voltage thereof. From this time forward, the field effect transistor T8 is conductive and connects the input 31 to the output 29. In operation, the capacitor is charged and the electronic protection circuit in FIG. 5 is free of shunt currents.

In addition to the embodiments described in the foregoing, the invention also includes those in which an n-conducting substrate is provided with p-conducting, well-like semiconductor zones, in which case the conductivity types of all the semiconductor components and the polarities of all the voltages are replaced by those of the opposite type.

In addition, the invention also includes those embodiments which result from FIGS. 1 and 2 by virtue of the following modifications. The boundary line B1 is omitted, in which case these two components can now be considered as an n-conducting substrate. On this basis, a p-conducting, well-like semiconductor zone is then inserted into this n-conducting substrate, where the p-conducting semiconductor zone is delimited from the n-conducting substrate by the broken line B2 and contains the circuit components T2, T3, C, T4 and 18.

A preferred application of the invention relates to peripheral circuits of densely packed dynamic semiconductor memories which are monolithically integrated with the storage cells.

Although various minor changes and modifications might be suggested by those skilled in the art, it will be understood that we wish to include within the claims of the patent warranted hereon all such changes and modifications as reasonably come within our contribution to the art.

We claim as our invention:

1. An integrated circuit, comprising:
   a doped semiconductor substrate;
   complementary MOS-circuitry in the substrate;
   a substrate bias voltage terminal in the doped semiconductor substrate connected to an output of a substrate bias voltage generator;
   a capacitor having first and second capacitor surfaces, the first capacitor surface being integrated in the doped semiconductor substrate, and the second capacitor surface being connected via an electronic protection circuit means to a capacitor bias voltage generator; and
   said electronic protection circuit means interconnecting the second capacitor surface and the capacitor bias voltage generator following a delay time $\Delta T$ when the integrated circuit is switched on.

2. An integrated circuit according to claim 1 wherein a well-like semiconductor zone is provided in the substrate.

3. An integrated circuit according to claim 2 wherein the substrate is of first conductivity type, a well-like zone is of second conductivity type, the well-like zone has a first conductivity type channel FET therein, and the substrate has a second conductivity type channel FET therein outside of said well-like zone together with a storage cell formed of a second conductivity type channel FET connecting to said capacitor.

4. An integrated circuit according to claim 2 wherein the well-like zone encompasses the substrate bias voltage terminal and said capacitor, and wherein a storage cell is provided formed of an FET connecting to said capacitor, and wherein at least one further FET is provided of one conductivity type within said well-like zone and another FET of an opposite conductivity type is provided outside of said well-like zone.

5. An integrated circuit according to claim 1 wherein the electronic protection circuit means comprises a timer connecting to an electronic switch through an amplifier.

6. An integrated circuit according to claim 5 wherein the timer has a series connection of a load element and a first field effect transistor, a first terminal at one end of this series arrangement which is a terminal of the load element being connected to a positive voltage, and a second terminal of this series arrangement which comprises source, drain, and substrate terminals of the first field effect transistor being connected to ground potential.

7. An integrated circuit according to claim 6 wherein the electronic switch has an n-channel field effect transistor whose gate terminal is connected to a connection point of the first field effect transistor and the load element of the series arrangement, a substrate terminal of the n-channel field effect transistor being connected to a negative voltage, a source terminal of the n-channel field effect transistor being connected to the second capacitor surface, and a drain terminal of the n-channel field effect transistor being connected to the capacitor bias voltage generator.

8. An integrated circuit according to claim 6 wherein the load element is formed by a second field effect transistor of a channel type different than a channel type of the first field effect transistor, a gate terminal of the second field effect transistor being connected to the ground potential, and a substrate terminal of the second field effect transistor being connected to the positive voltage.

9. An integrated circuit according to claim 5 wherein the timer has a series arrangement of a load element and a first field effect transistor, a first terminal of said series arrangement which comprises source, drain, and substrate terminals of the first field effect transistor being connected to a positive voltage, and a second terminal of said series arrangement which is a terminal of the load element is connected to ground potential.

10. An integrated circuit according to claim 9 wherein the electronic switch has a p-channel field effect transistor, a gate terminal of the p-channel field effect transistor being connected to a connection point of the first field effect transistor and the load element of the series arrangement, a substrate terminal of the p-channel field effect transistor being connected to the positive voltage, a drain terminal of the p-channel field effect transistor being connected to the second capacitor surface, and a source terminal of the p-channel field effect transistor being connected to the capacitor bias voltage generator.

11. An integrated circuit according to claim 9 wherein the load element is formed of a field effect transistor of a channel type different than a channel type of the first field effect transistor, a gate terminal of the field effect transistor being connected to the positive voltage and a substrate terminal of the field effect transistor being connected to a negative voltage.

12. An integrated circuit according to claim 1 wherein the output of the substrate bias voltage generator is connected via an electronic switch to a circuit point at ground potential, and the electronic switch is driven via a voltage obtained from the substrate bias voltage terminal.

13. An integrated circuit according to claim 1 wherein the substrate bias voltage generator, the capacitor bias voltage generator, and the electronic protection circuit means are co-integrated on the semiconductor substrate.

14. An integrated circuit according to claim 1 wherein densely integrated dynamic semiconductor memories are provided in the substrate.

15. An integrated circuit, comprising:
   a substrate having at least a first FET of first channel conductivity type and a complementary second FET of second conductivity type, and a well-like zone in the substrate containing one of said first and second FETs;
   a storage cell in the substrate formed of a third FET connected to a capacitor having first and second surfaces, the first surface being a doped region surrounded by the substrate and a second surface overlying the first surface;
   a substrate bias voltage terminal in the substrate;
   a substrate bias voltage generator connected at one side to a supply voltage and at the other side to said substrate bias voltage terminal;
   a bias voltage generator connected at one side to a supply voltage and at an opposite side through an electronic protection circuit to said second surface of the capacitor; and
   said electronic protection circuit having means for interconnecting the second capacitor surface and the capacitor bias voltage generator following a delay time $\Delta T$ when the integrated circuit is activated.

* * * * *